United States Patent
Anstrom et al.

(10) Patent No.: US 6,894,228 B2
(45) Date of Patent: May 17, 2005

(54) HIGH PERFORMANCE DENSE WIRE FOR PRINTED CIRCUIT BOARD

(75) Inventors: Donald O. Anstrom, Endicott, NY (US); Bruce J. Chamberlin, Vestal, NY (US); John M. Lauffer, Waverly, NY (US); Voya R. Markovich, Endwell, NY (US); David L. Thomas, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 338 days.

(21) Appl. No.: 10/217,674

(22) Filed: Aug. 12, 2002

(65) Prior Publication Data

US 2003/0006857 A1 Jan. 9, 2003

Related U.S. Application Data

(62) Division of application No. 09/834,280, filed on Apr. 12, 2001, now Pat. No. 6,495,772.

(51) Int. Cl.[7] ................................................. H05K 1/02
(52) U.S. Cl. ........................ 174/255; 174/261; 174/262
(58) Field of Search .................... 700/21, 121; 174/255, 174/261, 262; 29/829, 830

(56) References Cited

U.S. PATENT DOCUMENTS

| | | |
|---|---|---|
| 4,902,610 A | 2/1990 | Shipley |
| 5,336,855 A | 8/1994 | Kahlert et al. |
| 5,418,690 A | 5/1995 | Conn et al. |
| 5,768,109 A | 6/1998 | Gulick et al. |
| 5,808,521 A * | 9/1998 | Tosaka ........................ 333/128 |
| 6,023,211 A | 2/2000 | Somei |
| 6,075,423 A | 6/2000 | Saunders |
| 6,222,740 B1 | 4/2001 | Bovensiepen et al. |
| 6,246,010 B1 | 6/2001 | Zenner et al. |
| 6,480,396 B2 * | 11/2002 | Ninomiya .................... 361/780 |
| 6,720,502 B1 * | 4/2004 | Alcoe et al. ................. 174/262 |
| 6,737,749 B2 * | 5/2004 | Tomsio et al. .............. 257/774 |

FOREIGN PATENT DOCUMENTS

JP            404025155        1/1992

* cited by examiner

*Primary Examiner*—Albert W. Paladini
(74) *Attorney, Agent, or Firm*—Schmeiser, Olsen & Watts; William H. Steinberg

(57) ABSTRACT

A method and structure for implementing dense wiring, in printed circuit board or chip carrier applications, which provides superior electrical characteristics while preserving the system resistance and characteristic impedance requirements. The dense wiring is characterized by requiring that all wires have a sufficient cross-sectional area to ensure the longest wires used do not exceed a maximum resistance by either sorting wire lengths and allowing acceptably "short" wires to use denser circuit lines or by providing short lengths of short circuit lines in those areas where necessary and switching to less dense, lower resistance lines where possible. The disclosure also provides for dense wiring in component areas that can then be converted to low resistance wiring with application of a buried via.

21 Claims, 3 Drawing Sheets

HIGH PERFORMANCE DENSE WIRE FOR PRINTED CIRCUIT BOARD

This application is a divisional of Ser. No. 09/834,280 filed on Apr. 12, 2001 now U.S. Pat. No. 6,495,772.

BACKGROUND OF THE INVENTION

1. Technical Field

The present invention relates to a method and stricture for implementing dense wiring, in printed circuit board or chip carrier applications, which provides superior electrical characteristics while preserving system resistance and characteristic impedance requirements.

2. Related Art

Semiconductor chip size continues to decrease, with an attendant increase in component density. The electrical signals which provide communication between chips, via electrically conductive wires or lines, are characterized by increasing operational frequencies. Semiconductor chips mounted on a printed circuit board ("PCB") are subjected to detrimental effects caused by the inherent resistance of the PCB wiring which interconnects the semiconductor chips. A typical high performance printed circuit board has traditionally not been able to use wiring densities beyond a certain point due to limitations imposed by the DC resistance maximum in interchip wiring networks. Similarly, higher frequency signals also demand wide lines as a means to minimize "skin effect" losses in long lines. Unfortunately, it is problematic to generate dense wiring between a plurality of semiconductor chips on a PCB or chip carrier.

The usual solution is to use the typical geometry of wide wire lines and appropriate dielectric layer thicknesses to produce a 50 ohm transmission line characteristic impedance ($Z_o$), and achieve a wiring network with a single wiring layer pair that uses only lower capacitance buried vias and a limited number of higher capacitance plated through hole vias. The result of this approach is that more wiring layers are required, and with a correspondingly thicker printed circuit board structure resulting. Future projections of component input/output (I/O) counts (e.g., approaching 4000 I/0 counts with an I/O pitch of 0.8 mm) require a solution other than this usual practice.

An alternative is to use fine wire lines that widen when sufficient space is available. However, these wire lines do not maintain the necessary transmission line characteristic impedance ($Z_O$) in all areas. These wire lines also have circuitization yield implications that make them unattractive in most printed circuit board applications.

Thus, there is a need for a method and structure that implements dense wiring, in printed circuit board or chip carrier applications, and which provides superior electrical characteristics while preserving the system resistance and characteristic impedance requirements.

SUMMARY OF THE INVENTION

The present invention discloses a structure and associated method of implementing dense wiring, in printed circuit board or chip carrier applications, which provides superior electrical characteristics while preserving the system resistance and characteristic impedance requirements. In addition, the present invention provides reduced thickness printed circuit boards by providing selective dense wiring layers, and enables dense designs that were heretofore difficult to wire.

The present invention provides a multilayered circuit board assembly comprising: a first wiring layer having at least one first conductor, each first conductor having a first cross-sectional area; a second wiring layer having at least one second conductor, the second conductor having a cross-sectional area smaller than a cross-sectional area of said first conductor; said multilayered circuit board assembly having a first area of high component density and a second area of lower component density; said first area of high component density connected to said at least one second conductor.

The present invention further provides a method of increasing circuit wiring density in a printed circuit board while maintaining an impedance level and reducing electrical noise, said method comprising: providing a first wiring layer containing at least one first wire type having a first impedance, said first wiring layer having a first conductor; providing a second wiring layer containing at least one second wire type having a second impedance, said second wiring layer having a second conductor; wherein the impedance of said first wire type is equal to the impedance of said second wire type; and wherein said first wire type is used to produce said first conductor, and said second wire type is used to produce said second conductor.

The present invention also provides a multilayered circuit board assembly having a plurality of networks, said multilayered circuit board comprising: a first wiring layer having at least one first conductor, the first conductor having a first cross-sectional area; a second wiring layer having at least one second conductor, the second conductor having a second cross-sectional area, said second cross-sectional area being smaller than said first cross-sectional area; said multilayered circuit board having a maximum wire resistance limit; and said second wiring layer having electrical connections to networks such that the total resistance of the network connections remains within a maximum wire resistance limit.

The present invention additionally provides a method of maintaining a characteristic impedance level in wires of a printed circuit board, said method comprising: providing a first wiring layer containing at least one first wire of a first type, wherein said first wire has a first cross-sectional area; providing a second wiring layer containing at least one second wire of a second type, wherein said second wire has a second cross-sectional area; wherein said first cross-sectional area is not equivalent to said second cross-sectional area; and wherein said first wire and said second wire have the same electrical characteristic impedance.

The present invention therefore provides a method and structure that implements dense wiring, in printed circuit board or chip carrier applications, which provides superior electrical characteristics, while preserving the system resistance and characteristic impedance requirements.

DETAILED DESCRIPTION OF THE INVENTION

The present invention solves the issue of requiring all wires to have a large cross-sectional area so as to ensure that the longest wires used do not exceed a given maximum resistance, by either sorting wire lengths and allowing acceptably "short" wires to use dense circuit lines, or by providing short lengths of wire lines in those areas where necessary and switching to less dense lower resistance wire lines where possible. Statistics for large printed circuit boards indicate that over fifty percent of the wired networks on a typical printed circuit board have total wire lengths that are one-half as long as the longest wires. Often, fifty percent of the wired networks on a high performance board are only one-third the length of the longest wired networks.

Figure 1:
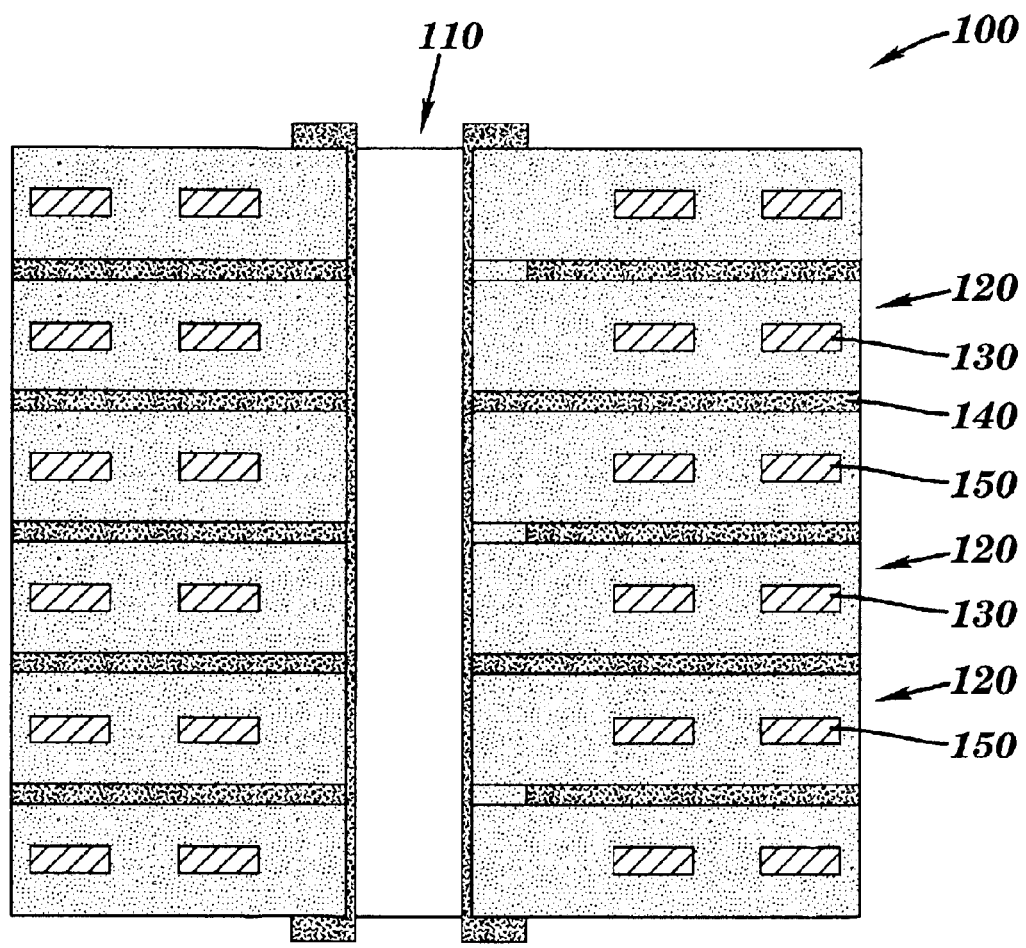
FIG. 1 depicts a cross-sectional view of a related art multilayered printed circuit board having a conventional structure.

Referring now to the drawings and beginning with FIG. 1, a cross-sectional view of a related art multilayered printed board structure (PCB) 100 is shown. The multilayer printed circuit board structure 100 is comprised of a plurality of wire cores or wire layers 120, which are stacked on top of each other in a dielectric medium, and separated by reference plane 140, to form the multilayered printed board structure 100. Each wire layer 120 contains a plurality of individual wires 130, 150. In the conventional multilayered printed board structure 100, each wire 130, 150 in each wire layer 120 has approximately the same geometry, and therefore, approximately the same inherent electrical characteristics (i.e., resistance, capacitance, impedance, etc.). The same geometry is employed for two reasons. First, to preserve the transmission line impedance of the wires 130, 150. Second, to meet a specified maximum DC resistance based upon the length of the longest interconnect wire on the multilayered printed board structure 100. Thus, the conventional multilayered printed board structure 100 yields a high performance interconnect environment, but one which lacks dense circuitization due to the relatively wide (i.e., >75 um, typically) wires 130, 150.

This lack of dense circuitization results in a need for more layers of wire cores 120 in order to accomplish the required wire interconnects, which in turn produces thicker printed circuit board structures. Interconnections between the wires in individual wire cores 120 are accomplished with a device such as a plated through hole via 110. However, the plated through hole via 110 has the drawback of an inherent capacitance. This capacitance has detrimental effects on propagated signals, caused by the transmission-line-related performance characteristics of the wires 130, 150, especially in high performance circuit applications. Therefore, PCB structures which require additional capacitance-producing plated through hole vias to interconnect an increased number of wiring layers are not desirable.

The deterioration of a propagated signal is expressed in terms of either the "rise-time" or the "fall-time" of the signal's response to a step change. The deterioration of the propagated signal can be quantified with the formula $(Z_0 * C)/2$, where $Z_0$ is the transmission line characteristic impedance, and C is the amount of the via capacitance. In a wire having a typical 50 ohm transmission line impedance, a plated through hole via having a capacitance of 4 pico farad (pf) would represent a 100 pico-second (ps) rise-time (or fall time) degradation, as compared to a 12.5 ps degradation with a 0.5 pf buried via of the present invention, as discussed below. This difference is significant in systems operating at 800 MHz or faster, where there are associated signal transition rates of 200 ps or faster.

Figure 2:
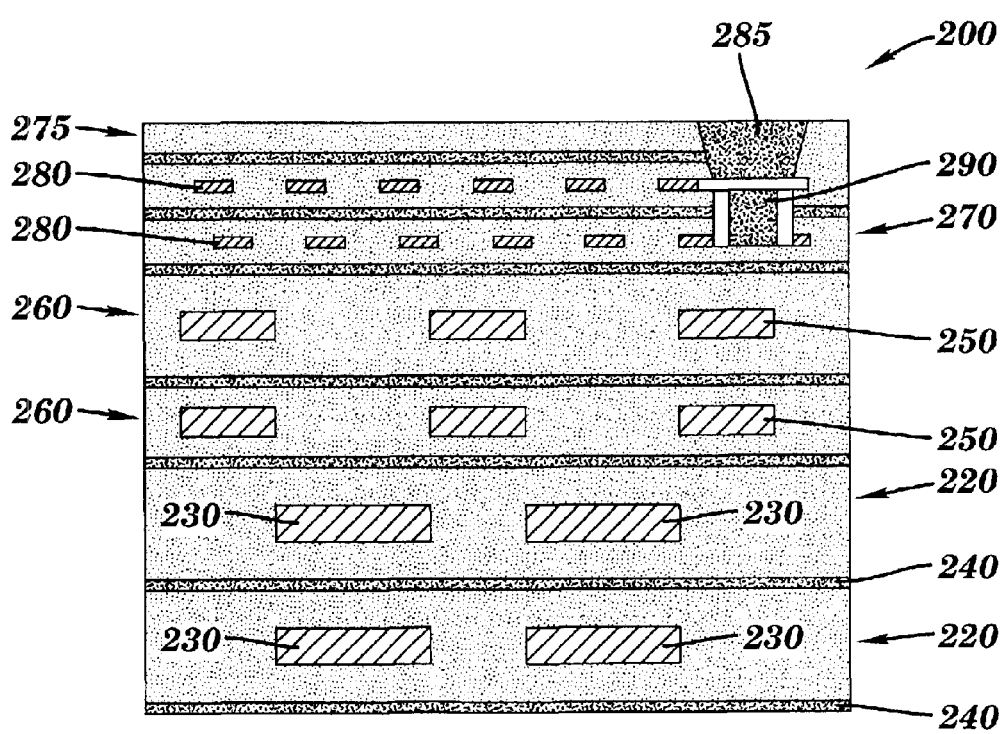
FIG. 2 depicts a cross-sectional view of a multilayered printed circuit board in accordance with a first embodiment of the present invention.
Figure 3:
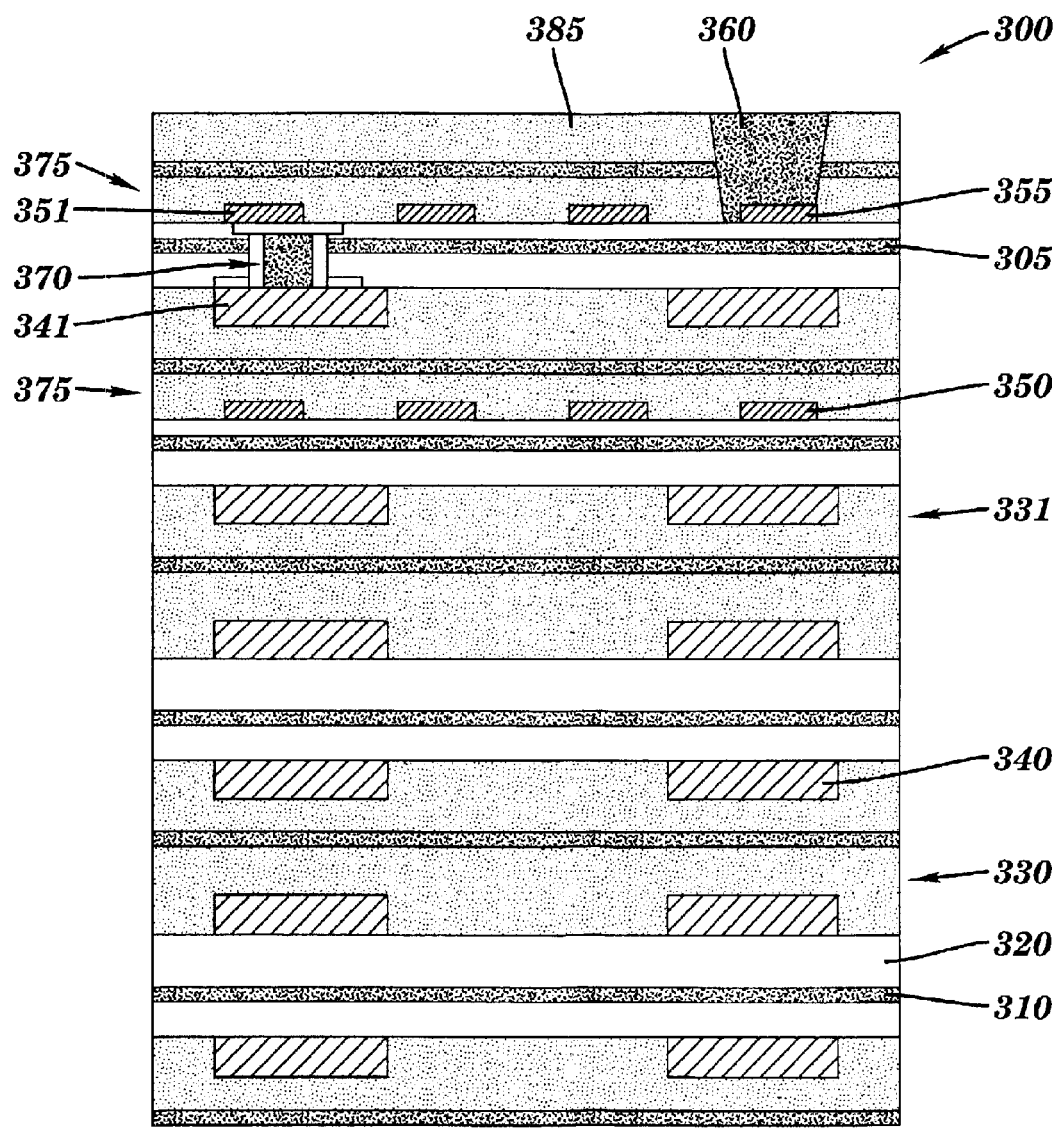
FIG. 3 depicts a cross-sectional view of a multilayered printed circuit board in accordance with a second embodiment of the present invention.

The present invention discloses two approaches to alleviating the deterioration of the propagated signal, which may be used singly or in combination. The first approach is to use circuit wires for shorter network interconnections, wherein these wires are characterized by having a higher resistance and a controlled transmission line characteristic impedance ($Z_0$). This first approach is illustrated in FIG. 2. The second approach is to use densely spaced wires in areas of the PCB where components are mounted, and to convert these densely spaced wires to less densely spaced, low resistance wires (where space allows) with one or more buried vias. The second approach is illustrated in FIG. 3.

Referring now to FIG. 2, a multilayered printed circuit board structure 200 is shown. The multilayered printed circuit board stricture 200 is composed of a plurality of wire cores or wire layers 220, 260, 270, separated by a reference planes 240. The wire layers 220, 260, 270 contain wires 230, 250, 280 of various dimensions.

More specifically, there are two coarse wiring layers 220, each of which contains closely spaced wires 230 having a relatively large cross-sectional area. Next, intermediate wire layers 260 are formed on the uppermost coarse wiring layer 220. These intermediate wire layers 260 contain intermediate-sized wires 250. Since these intermediate-sized wires are of smaller cross-sectional area than the coarse wires 230, more of these intermediate-sized wires 250 can be accommodated in wire layer 260 than if coarse wires were used. And, wire layer 260 can be thinner than the corresponding coarse wire layer 220.

Finally, dense wire layers 270 are formed on the uppermost intermediate wire layer 260.

Each dense wire layer 270 contains a plurality of closely spaced dense wires 280, each of which has a relatively small cross-sectional area (i.e., typically about $1*10^{-9}$ m$^2$). Because each dense wire 280 has such a small cross-sectional area, and they are closer to the reference plane, they can be placed in close proximity to each other, and dense circuitization results. The dense wires 280 are contained completely within the dense wire layer 270, which facilitates complete testing of the dense wire layer 270 prior to assembly of the full printed circuit board. This process provides for a printed circuit board assembly yield that is not influenced by the anticipated lower yield of the dense wire layer 270.

Electrical interconnections between dense wires 280 in different dense wire layers 270 are accomplished by constructing a buried via 290 using techniques known in the art. To facilitate access to individual dense wires 280 in the dense wire layer 270 can be accomplished by forming a blind via 285 in the capping layer 275. The blind via 285 may be formed using laser ablation techniques, or other techniques known in the art, such as photo-imageable processes, plasma etching, or controlled-depth mechanical drilling. Blind via 285 may also extend through one or more of the wire layers, thus permitting access to other wires on other wire layers.

Referring now to FIG. 3, the second approach is illustrated which uses circuit wires for shorter network interconnections, wherein these wires are characterized by having a higher resistance and controlled transmission line characteristic impedance ($Z_0$).

The multilayered printed circuit board structure 300 is again composed of a plurality of wire cores or wire layers 330, 331, 375 separated by reference planes 305, 310, and mounted on a substrate layer 305. The wire layers 330, 331, 375 contain wires 340, 350 of various dimensions.

More specifically, there are coarse wiring layers 330, each of which contains coarse wires 340 having a relatively large cross-sectional area. Next, fine wire layers 375 are formed on the coarse wiring layer 331. These fine wire layers 375 contain a plurality of fine wires 350. Since these fine wires 350 are of smaller cross-sectional area than the coarse wires 340, 331, 341, more of the fine wires 350 can be accommodated in wire layers 355 and 375 than if coarse wires were used. And, wire layer 375 can be thinner than the corresponding coarse wire layer 330.

A buried via 370 can also be used to convert from a fine wire 351 in a component-dense area to a low resistance coarse wire 341 in a different coarse wire layer. The buried via 370 is formed using techniques known in the art. Access to individual fine wires 355 in the dense wire layer 375 can be accomplished by forming a blind via 360 in the capping layer 385. The blind via 360 may also extend through one or more of the wire layers, permitting access to other wires as necessary. Blind via 360 may be a laser-ablated via, or may be formed using other techniques known in the art.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method of maintaining a characteristic impedance level in wires of a printed circuit board, said method comprising:
   providing a first wiring layer containing a first wire of a first type, wherein said first wire has a first cross-sectional area;
   providing a second wiring layer containing a second wire of a second type, wherein said second wire has a second cross-sectional area;
   wherein said first cross-sectional area is not equivalent to said second cross-sectional area; and
   wherein said first wire and said second wire have a same electrical characteristic impedance.

2. The method of claim 1, further comprising:
   providing an interconnection from said first wire to said second wire, wherein said interconnection comprises a buried via.

3. The method of claim 1, wherein a reference plane is disposed between the first wiring layer and the second wiring layer, and wherein the first wiring layer is thicker than the second wiring layer.

4. The method of claim 3, wherein the first wiring layer is in contact with a first surface of the reference plane, and wherein the second wiring layer is in contact with second surface of the reference plane.

5. The method of claim 1, wherein at least one of said first wires is electrically connected to at least one of said second wires.

6. The method of claim 1, wherein at least one second wire in the second wiring layer is accessible through a via in the second wiring layer.

7. A method, comprising forming a multilayered circuit board assembly, said multilayered circuit board assembly comprising:
   a first wiring layer having at least one first conductor, each first conductor having a first cross-sectional area;
   a second wiring layer having at least one second conductor, the second conductor having a cross-sectional area smaller than the first cross-sectional area of said first conductor;
   said second wiring layer having a first area of high component density and said first wiring layer having a second area of lower component density;
   said first area of high component density connected to said at least one second conductor.

8. The method of claim 7, wherein at least one of said second conductors is electrically connected to at least one of said first conductors.

9. The method of claim 7, wherein a buried via electrically connects at least one of said second conductors with at least one of said first conductors.

10. The method of claim 7, wherein at least one second conductor in the second wiring layer is accessible through a via in the second wiring layer.

11. The method of claim 7, wherein the second conductor is electrically connected to the first conductor with a plated through hole via.

12. The method of claim 7, wherein the second conductor and the first conductor are separated by one or more wiring layers.

13. The method a claim 7, wherein a reference plane is disposed between the first wiring layer and the second wiring layer, and wherein the first wiring layer is thicker than the second wiring layer.

14. The method of claim 13, wherein the first wiring layer is in contact with a first surface of the reference plane, and wherein the second wiring layer is in contact with a second surface of the reference plane.

15. A method, comprising forming a multilayered circuit board, said multilayered circuit baud comprising a plurality of wiring layers that includes a first wiring layer and a second wiring layer:
   said first wiring layer having at least one first conductor, the first conductor having a first cross-sectional area;
   said second wiring layer having at least one second conductor, the second conductor having a second cross-sectional area, said second cross-sectional area being smaller than said first cross-sectional area;
   said multilayered circuit board having a maximum wire resistance limit;
   said second wiring layer having electrical connections to networks such that a sum of the resistances of the network connections does not exceed the maximum wire resistance limit;
   each of said networks comprised by the plurality of wiring layers.

16. The method of claim 15, further comprising testing the second wiring layer prior to assembly into the multilayered circuit board.

17. The method of claim 15, wherein a reference plane is disposed between the first wiring layer and the second wiring layer, and wherein the first wiring layer is thicker than the second wiring layer.

18. The method of claim 17, wherein the first wiring layer is in contact with a first surface of the reference plane, and wherein the second wiring layer is in contact with a second surface of the reference plane.

19. The method of claim 15, wherein at least one of said second conductors is electrically connected to at least one of said first conductors.

20. The method of claim 15, wherein a buried via electrically connects at least one of said second conductors with at least one of said first conductors.

21. The method of claim 15, wherein the second conductor and the first conductor are separated by one or more wiring layers.

* * * * *